United States Patent
Matsunaga

(10) Patent No.: US 7,944,054 B2
(45) Date of Patent: May 17, 2011

(54) SEMICONDUCTOR DEVICE AND METHOD FOR FABRICATING SEMICONDUCTOR DEVICE

(75) Inventor: Noriaki Matsunaga, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 445 days.

(21) Appl. No.: 12/120,720

(22) Filed: May 15, 2008

(65) Prior Publication Data

US 2008/0308939 A1 Dec. 18, 2008

(30) Foreign Application Priority Data

May 15, 2007 (JP) .................................. 2007-128818

(51) Int. Cl.
*H01L 23/52* (2006.01)
(52) U.S. Cl. ......... 257/758; 257/E21.495; 257/E23.141; 438/622
(58) Field of Classification Search .................. 257/758, 257/E23.141, E21.495
See application file for complete search history.

(56) References Cited

U.S. PATENT DOCUMENTS

| | | | |
|---|---|---|---|
| 6,534,870 B1* | 3/2003 | Shimooka et al. ............. | 257/759 |
| 6,949,830 B2* | 9/2005 | Owada et al. ................. | 257/760 |
| 7,183,200 B2 | 2/2007 | Inoue | |
| 7,186,613 B2 | 3/2007 | Kirner et al. | |
| 7,250,679 B2 | 7/2007 | Otsuka | |
| 2006/0087041 A1* | 4/2006 | Fukuyama et al. ........... | 257/774 |
| 2006/0103017 A1 | 5/2006 | Usui et al. | |
| 2006/0192286 A1 | 8/2006 | Kanamura | |
| 2007/0187828 A1 | 8/2007 | Farooq et al. | |
| 2008/0308939 A1* | 12/2008 | Matsunaga ................... | 257/758 |

FOREIGN PATENT DOCUMENTS

| | | |
|---|---|---|
| JP | 2000-357737 | 12/2000 |
| JP | 2006-216746 | 8/2006 |

* cited by examiner

*Primary Examiner* — Benjamin P Sandvik
*Assistant Examiner* — Krista Soderholm
(74) *Attorney, Agent, or Firm* — Oblon, Spivak, McClelland, Maier & Neustadt, L.L.P.

(57) ABSTRACT

A semiconductor device includes a plurality of first group wiring layers laminated on a substrate, and each of the first group wiring layers having a wire formed with a first minimum wire width and a main dielectric film portion; and a plurality of second group wiring layers laminated on a top layer of the plurality of first group wiring layers and each of the second group wiring layers having a wire formed with a second minimum wire width greater than the first minimum wire width and a main dielectric film portion, wherein a main dielectric film portion in a bottom layer of the plurality of second group wiring layers has a relative dielectric constant which is substantially identical to a relative dielectric constant of main dielectric film portions of the other second group wiring layers, and Young's modulus of the main dielectric film portion in the bottom layer of the plurality of second group wiring layers is smaller than those of the main dielectric film portions of the other second group wiring layers and larger than those of main dielectric film portions of the first group wiring layers.

4 Claims, 7 Drawing Sheets

SEMICONDUCTOR DEVICE AND METHOD FOR FABRICATING SEMICONDUCTOR DEVICE

CROSS-REFERENCE TO RELATED APPLICATION

This application is based upon and claims the benefit of priority from prior Japanese Patent Application No. 2007-128818 filed on May 15, 2007 in Japan, the entire contents of which are incorporated herein by reference.

BACKGROUND OF THE INVENTION

In recent years, with higher degrees of integration and higher performance of semiconductor integrated circuits (LSI), new microprocessing technologies have been developed. In particular, to achieve a faster speed of LSI, there has been a growing trend recently to replace the conventional wire material of aluminum (Al) alloys with copper (Cu) or Cu alloys (hereinafter, called Cu together) having low resistance. Since it is difficult to apply the dry etching method, which is used for forming an Al alloy wire, to Cu for microprocessing, the so-called damascene process is mainly adopted for Cu, in which a Cu film is deposited onto a dielectric film to which groove processing has been provided and then the Cu film is removed except in portions where the Cu film is embedded in a groove by chemical mechanical polishing (CMP) to form an embedded wire. The Cu film is generally formed, after forming a thin seed layer by a sputtering process or the like, into a laminated film having a thickness of several hundred nanometers by the electro-plating method.

Further, when forming a multilayer Cu wire, particularly a wire formation method called the dual damascene structure can also be used. According to this method, a dielectric film is deposited onto a lower layer wire and predetermined via holes and trenches for upper layer wire are formed, and then Cu to be a wire material is embedded in the via holes and trenches simultaneously and further unnecessary Cu on the upper layer is removed by CMP for planarization to form an embedded wire.

Recently, the use of a low dielectric constant film (low-k film) having a low relative dielectric constant as an inter-level dielectric is studied. That is, an attempt is made to reduce parasitic capacitance between wires by using a low-k film whose relative dielectric constant k is 3 or less, instead of silicon oxide ($SiO_2$) whose relative dielectric constant k is about 4.1.

Currently, wiring layers are laminated into a multilayer interconnection by classifying wiring layers into wiring layer groups having a common minimum wire width. A multilayer interconnection is formed, for example, as a local layer on a device layer, an intermediate layer group on the local layer, a semi-global layer group formed thereon, and a global layer group formed thereon. The relative dielectric constant k of a main inter-level dielectric constituting each wiring layer in these groups is formed to have substantially the same value because wiring rules are common. Since the relative dielectric constant k needs to be made smaller with the group down the multilayer interconnection hierarchy, a low dielectric constant material is used, for example, for the semi-global layer group or so and below.

Generally, mechanical strength of low dielectric constant materials, particularly low dielectric constant films whose k is 3 or less, is weaker than that of non-low dielectric constant films. In addition, there is a tendency that mechanical strength of materials becomes weaker with decreasing dielectric constant. Using such low-k materials and lower mechanical strength of such materials may cause a peeling of multilayer interconnection. This problem is more likely to arise particularly, among multilayer interconnection manufacturing processes, in the CMP process in which a mechanical force is applied, a process in which a wafer is scribed to a chip shape, a process of fixing using a resin, and when a wafer is evaluated by probing.

Here, a technology of configuring dielectric films constituting each wiring layer of multilayer interconnection in such a way that strength/weakness of mechanical strength of the dielectric films alternates in the lamination direction so as not to cause defects such as film peeling and deformation in a multilayer interconnection structure is disclosed, for example, Japanese Patent Application Publication No. 2006-216746. However, according to such a technology in JP-2006-216746, mechanical strength is improved by a reinforcing film whose relative dielectric constant is large and thus, strength of the relative dielectric constant alternates from layer to layer. Therefore, originally desired wire performance is hardly obtainable from layers having a large relative dielectric constant.

BRIEF SUMMARY OF THE INVENTION

A semiconductor device in accordance with an aspect of the invention includes: a plurality of first group wiring layers laminated on a substrate, and each of the first group wiring layers having a wire formed with a first minimum wire width and a main dielectric film portion; and a plurality of second group wiring layers laminated on a top layer of the plurality of first group wiring layers and each of the second group wiring layers having a wire formed with a second minimum wire width greater than the first minimum wire width and a main dielectric film portion, wherein a main dielectric film portion in a bottom layer of the plurality of second group wiring layers has a relative dielectric constant which is substantially identical to a relative dielectric constant of main dielectric film portions of the other second group wiring layers, and Young's modulus of the main dielectric film portion in the bottom layer of the plurality of second group wiring layers is smaller than those of the main dielectric film portions of the other second group wiring layers and larger than those of main dielectric film portions of the first group wiring layers.

A method for fabricating a semiconductor device in accordance with an aspect of the invention includes: forming a plurality of first wiring layers on a substrate, each having a first wire of a first minimum wire width and a first dielectric film cured with a predetermined amount of supplied energy; forming a second wiring layer having a second wire of a second minimum wire width greater than the first minimum wire width and a second dielectric film obtained by curing a material identical to that of the first dielectric film with amount of supplied energy different from the predetermined amount of supplied energy on a top layer of the plurality of first wiring layers; and forming a third wiring layer on the second wiring layer, the third wiring layer having a third wire of the second minimum wire width and a third dielectric film whose relative dielectric constant is substantially identical to that of the second dielectric film and whose Young's modulus is larger than that of the second dielectric film.

A method for fabricating a semiconductor device in accordance with another aspect of the invention includes: forming a plurality of first wiring layers on a substrate, each having a first wire of a first minimum wire width and a first dielectric film; forming a second wiring layer having a second wire of a second minimum wire width greater than the first minimum wire width and a second dielectric film cured with a predetermined amount of supplied energy on a top layer of the plurality of first wiring layers; and forming a third wiring layer on the second wiring layer, the third wiring layer having a third wire of the second minimum wire width and a third dielectric film obtained by curing a material identical to that of the second dielectric film with amount of supplied energy different from the predetermined amount of supplied energy, whose relative dielectric constant is substantially identical to that of the second dielectric film and whose Young's modulus is larger than that of the second dielectric film.

DETAILED DESCRIPTION OF THE INVENTION

Devices in which peeling resistance between wiring layers in a multilayer interconnection is made to be improved and fabricating or manufacturing methods thereof in each embodiment will be described below.

First Embodiment

Figure 1:
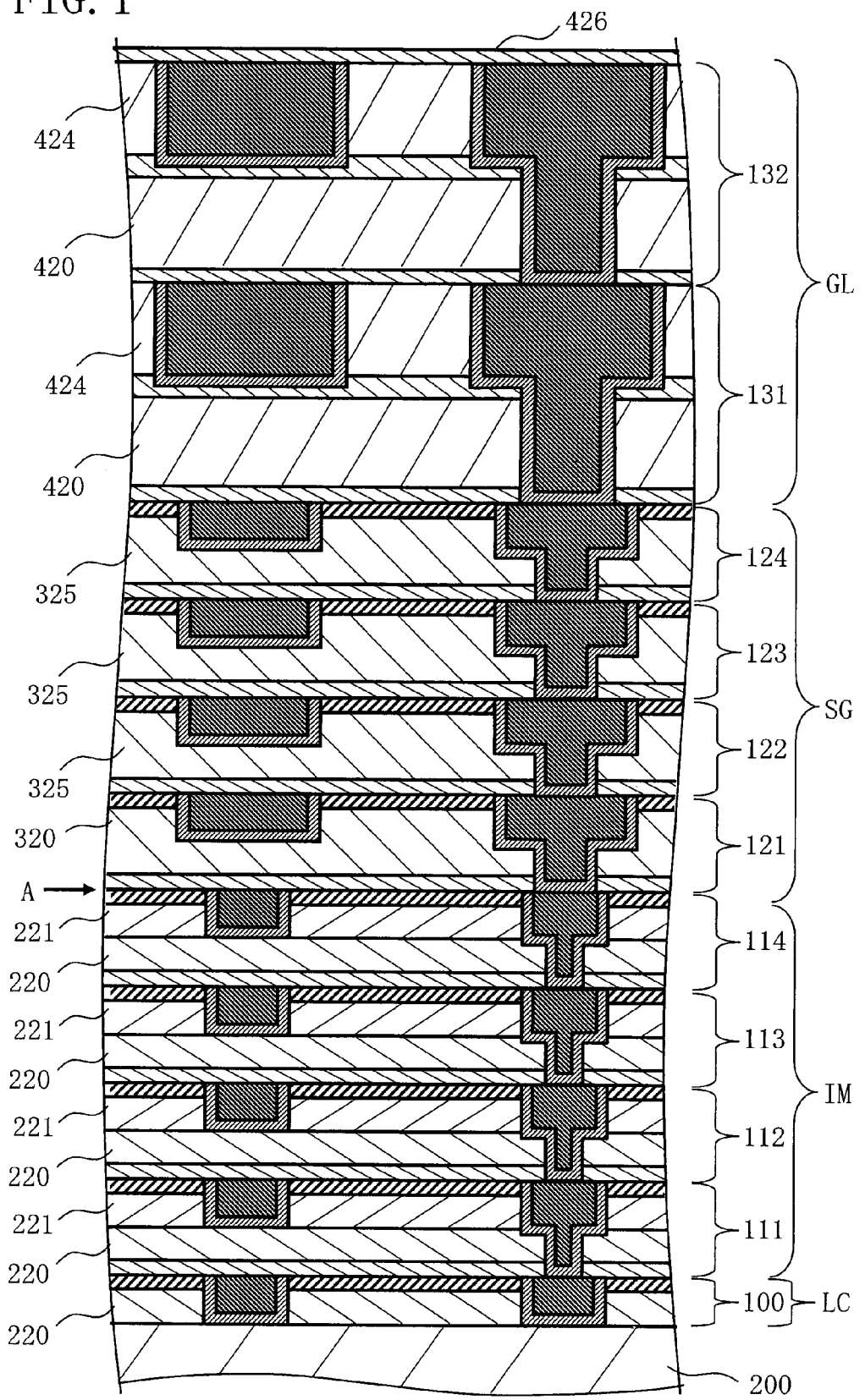
FIG. 1 is a diagram showing a cross section of a semiconductor device in a first embodiment.

A first embodiment will be described below with reference to drawings. FIG. 1 is a diagram showing a cross section of a semiconductor device in the first embodiment. When a multilayer interconnection structure is formed, wiring layers are laminated by classifying wiring layers into wiring layer groups having a common minimum wire width. In the example shown in FIG. 1, a local (LC) layer group is formed on a substrate 200, an intermediate (IM) layer group thereon, a semi-global (SG) layer group thereon, and a global (GL) layer group thereon. Then, the LC layer group consists, for example, of one layer of a wiring layer 100. The IM layer group consists, for example, of four layers of wiring layers 111, 112, 113, and 114. The SG layer group consists, for example, of four layers of wiring layers 121, 122, 123, and 124. The GL layer group consists, for example, of two layers of wiring layers 131, and 132. The number of laminated wiring layers in each group is not limited to the above example and may be more or less. The minimum wire width in each group increases from the LC layer group to the GL layer group. Moreover, a wire and a via plug for connecting the wire to the wire in the wiring layer below are formed in each wiring layer excluding the wiring layer 100. A silicon wafer of 300 mm in diameter, for example, is used as the substrate 200. Here, portions below the Cu wire, for example, a device portion, a tungsten (W) plug portion connected to the device portion and the like are not illustrated. An etching stopper and diffusion barrier film (hereinafter, it is indicated as ES film ) 426 is formed on a wiring layer 132, which is the top layer of the GL layer group.

Wiring layers in each group have a common minimum wire width and also have a main dielectric film having the relative dielectric constant k appropriate to the minimum wire width thereof formed therein. That is, a main dielectric film is formed so that the relative dielectric constant k of the main dielectric film has substantially the same value in each wiring layer of each group. For example, in the LC layer group, the relative dielectric constant k of a main dielectric film 220 is about 2.5 and here, a dielectric film of k=2.5±0.1 is used. In the IM layer group, the relative dielectric constant k of the main dielectric film 220 and a main dielectric film 221 formed by two layers is about 2.5 and here, dielectric films of k=2.5±0.1 are used. In the SG layer group, the relative dielectric constant k of a main dielectric film 320 of the wiring layer 121 and a main dielectric film 325 of the other wiring layers 122 to 124 is about 3.0 and here, dielectric films of k=3.0±0.1 are used. In the GL layer group, the relative dielectric constant k of main dielectric films 420, 424 formed by two layers is about 4.1 and here, dielectric films of k=4.1±0.1 are used.

An inter-level dielectric of each wiring layer is mostly formed by a multilayer structure containing a main dielectric film. For example, an etching stopper dielectric film is formed below a main dielectric film and a cap dielectric film is formed above the main dielectric film. Here, the same dielectric film is normally used for the wiring layers in the same group. However, if the same dielectric film is used for all wiring layers, while the coefficient of linear expansion of a main dielectric film is, for example, about 66 ppm/° C. for the LC layer group and the IM layer group, that for the SG layer group and the GL layer group is about 6 ppm/° C. and thus, if a force is applied from outside, stress is concentrated at a boundary A between the IM layer group and the SG layer group. Therefore, film peeling may occur at the boundary A. The Young's modulus (modulus of longitudinal elasticity: E) of a main dielectric film at this point is, for example, 5 to 7 GPa for the LC layer group and the IM layer group, for example, 13 to 25 GPa for the SG layer group and, for example, 50 GPa for the GL layer group. Here, the main dielectric film refers to remaining dielectric films after removing etching stopper films and cap dielectric films from all dielectric films. Thus, the main dielectric film may be a laminated film. If the main dielectric film is formed as a laminated film, the relative dielectric constant and Young's modulus of the main dielectric film may be those displayed by the main dielectric films of the laminated film as a whole, or those displayed by one of main dielectric films of the laminated film.

If a laminated layer is peeled after a force being applied from outside, instead of low-k film layers with low mechanical strength being destroyed, particularly peeling is more likely to occur at a boundary where a difference of coefficients of linear expansion between wiring layers is large. A plurality of dielectric films is used in one wiring layer by laminating them, and little effect is produced on the above peeling problem by increasing adhesion intensity at each interface between dielectric films inside the wiring layer.

Thus, in the first embodiment, while maintaining the relative dielectric constant k of the main dielectric film 320 of the wiring layer 121, which is the bottom layer in the SG layer group, substantially the same (k=3.0±0.1) as those of the other wiring layers 122 to 124 of the SG layer group, the main dielectric film 320 is formed in such a way that the Young's modulus E thereof becomes larger than at least one of that of the main dielectric film 220 and that of the main dielectric film 221 of the wiring layer 114 of the IM layer group and smaller than those of the main dielectric films 325 of the other wiring layers 122 to 124 of the SG layer group. That is, the main dielectric film 320 is formed with the Young's modulus E of 8 to 17 GPa to satisfy the above conditions. The relative dielectric constant k of the main dielectric film 320 of the wiring layer 121 is maintained substantially the same as those of the other wiring layers 122 to 124 of the SG layer group because, if the relative dielectric constant of the wiring layer 121 is different from those of the wiring layers 122 to 124, the wiring layers to be designed with the same design rules and the same design parameters will be an independent wiring layer group. In order to make design parameters of the wiring layer 121 substantially the same as those of the other wiring layers 122 to 124 of the SG layer group, which is an upper wiring group, the relative dielectric constant k is made equal so that the relative dielectric constant of the wiring layer 121 becomes approximately the same as that of the other wiring layers 122 to 124.

If, for example, the Young's modulus E of the dielectric film 220 is 7 GPa, that of the dielectric film 221 is 5 GPa, and those of the dielectric films 325 of the wiring layers 122 to 124 are 20 GPa, the dielectric film 320 is formed so that the Young's modulus thereof is 17 GPa. Or, if the Young's modulus E of the dielectric film 220 is 7 GPa, that of the dielectric film 221 is 5 GPa, and those of the dielectric films 325 of the wiring layers 122 to 124 are 25 GPa, the dielectric film 320 is formed so that the Young's modulus thereof is 15 GPa. Or, if the Young's modulus E of the dielectric film 220 is 5 GPa and those of the dielectric films 325 of the wiring layers 122 to 124 are 13 GPa, the dielectric film 320 is formed so that the Young's modulus thereof is 8 GPa. Accordingly, a rapid change of the Young's modulus E near the boundary A where stress is concentrated is lessened. As a result, the dielectric film 320 serves as a buffer to improve resistance against peeling of a film caused by force of external factors. A fabricating method of wiring layers of each group will be described below.

Figure 2:
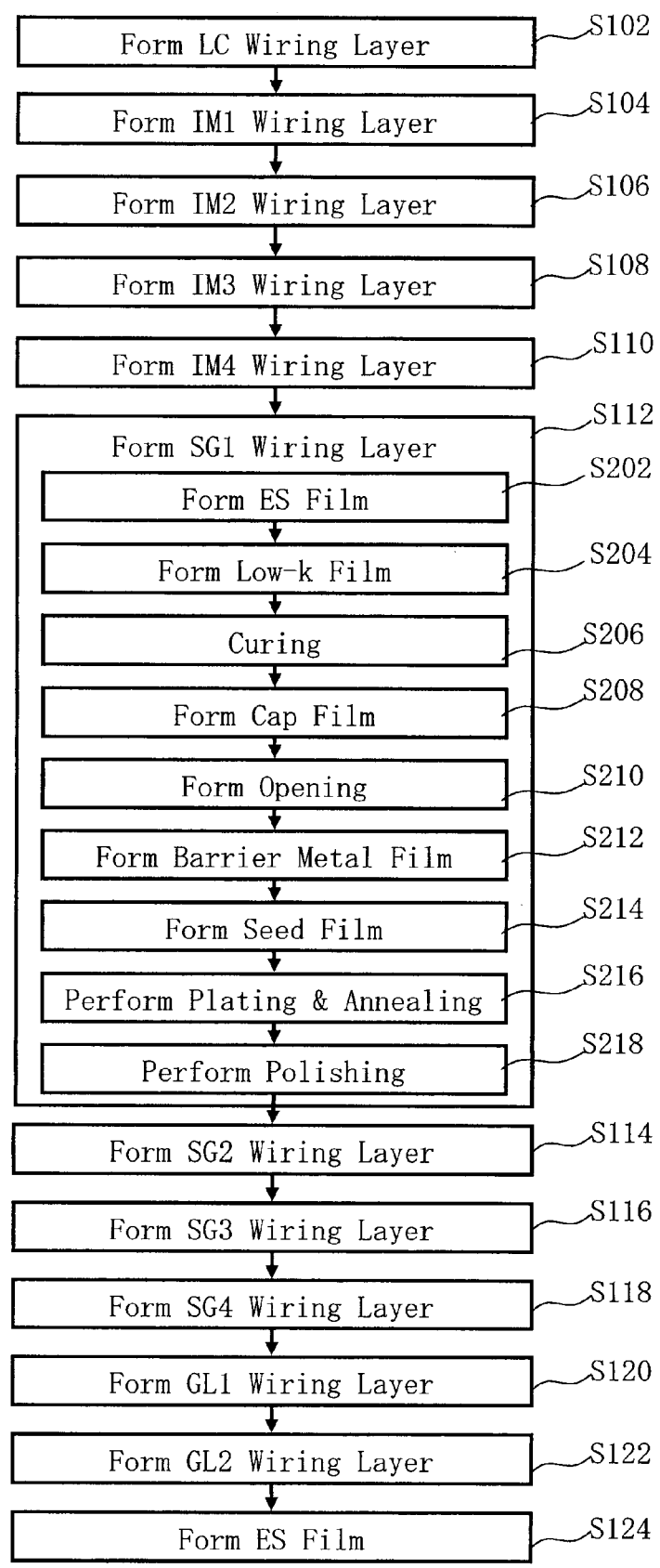
FIG. 2 is a flowchart showing parts of a fabricating method of the semiconductor device in the first embodiment.

FIG. 2 is a flow chart showing parts of a fabricating method of the semiconductor device in the first embodiment.

In FIG. 2, the manufacturing method of the semiconductor device in the first embodiment performs a series of processes including an LC wiring layer formation process (S102), an IM1 wiring layer formation process (S104), an IM2 wiring layer formation process (S106), an IM3 wiring layer formation process (S108), an IM4 wiring layer formation process (S110), an SG1 wiring layer formation process (S112), an SG2 wiring layer formation process (S114), an SG3 wiring layer formation process (S116), an SG4 wiring layer formation process (S118), an GL1 wiring layer formation process (S120), an GL2 wiring layer formation process (S122), and an ES film formation process (S124) The SG1 wiring layer formation process (S112) performs, as its internal processes, a series of processes including an ES film formation process (S202), a low-k film formation process (S204), a cure process (S206), a cap film formation process (S208), an opening formation process (S210), a barrier metal film formation process (S212), a seed film formation process (S214), a plating and annealing process (S216), and a polishing process (S218).

Figure 3:
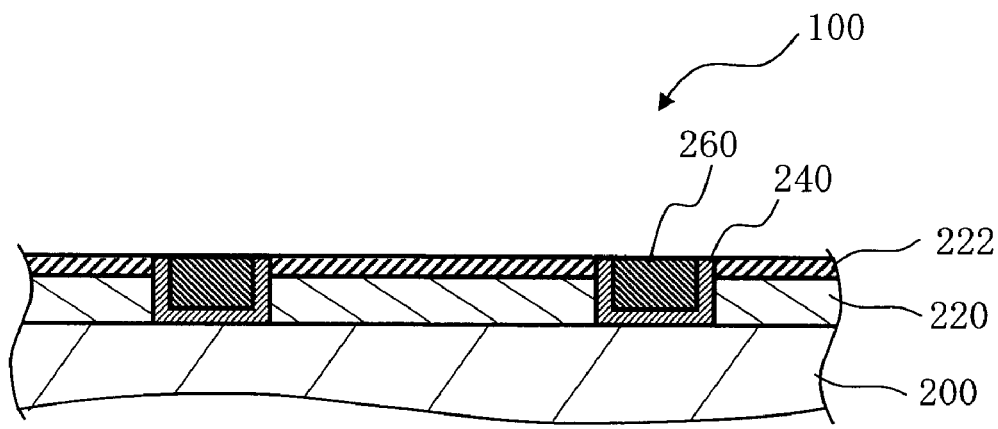
FIG. 3 is a diagram showing an example of the cross section of an LC (local) wiring layer in the first embodiment.

First, at step S102, the wiring layer 100 is formed on the substrate 200 as the LC wiring layer formation process. FIG. 3 is a diagram showing an example of the cross section of an LC wiring layer in the first embodiment. First, the dielectric film 220 using a porous low-dielectric constant dielectric material is formed on the substrate 200 to a thickness of 100 nm. Porous silicon oxycarbide (SiOC) may suitably be used as the material of the dielectric film 220. Using a porous SiOC film, an inter-level dielectric whose relative dielectric constant k is about 2.5 can be obtained. Here, the dielectric film 220 is formed, as an example, using material whose main component is methylsiloxane. In addition to polymethylsiloxane whose main component is methylsiloxane, a film having siloxane backbone structures such as polysiloxane, hydrogen silsesquioxane, and methylsilsesquioxane may be used as materials of the dielectric film 220. The SOD (spin on dielectric coating) method by which a thin film is formed by spin-coating and heat-treating a solution may be used as a formation method. The dielectric film 220 is formed, for example, by forming a film by a spinner, baking the substrate on a hot plate in a nitrogen atmosphere, and then curing the substrate at temperature higher than that during baking on the hot plate in the nitrogen atmosphere. In addition to the SOD method, the chemical vapor deposition (CVD) method may be used as a formation method.

Then, by depositing, for example, 20 nm of SiOC on the dielectric film 220 by the CVD method, a cap dielectric film 222 is formed. In addition to SiOC whose relative dielectric constant k is, for example, about 3.0, $SiO_2$ whose relative dielectric constant k is about 4.0 can be used as the cap dielectric film 222. By forming the cap dielectric film 222, the dielectric film 220 of SiOC whose mechanical strength is weak can be protected.

Then, a trench for making a damascene wire in lithography and dry etching processes is formed in the cap dielectric film 222 and the dielectric film 220. Then, a barrier metal film 240 using a barrier metal material is formed in the trench and on the surface of the cap dielectric film 222 by the physical vapor deposition (PVD) method such as sputtering. As the material of the barrier metal film 240, for example, tantalum containing materials such as tantalum (Ta) and tantalum nitride (TaN), titanium containing materials such as titanium (Ti) and titanium nitride (TiN), or laminated films combining Ta and TaN and the like are suitable. Then, a Cu thin film to be a cathode electrode in the next electro-plating process is caused to deposit (form) on the inner wall of the trench and the surface of the substrate 200 where the barrier metal film 240 is formed as a seed film by the physical vapor deposition (PVD) method such as sputtering. Then, with the seed film as the cathode electrode, a Cu film 260 (an example of copper containing film) is caused to deposit inside the trench and on the surface of the substrate 200 by the electrochemical deposition method such as electroplating. Then, after annealing treatment, the extra Cu film 260 and barrier metal film 240 deposited on the trench in such a state are removed by CMP to form a damascene wire to form the wiring layer 100. For example, a Cu wire whose minimum wire width is 65 nm can be formed. Then, for example, a wiring layer whose minimum wiring rule of line and space is 65 nm/65 nm and whose wiring height is 120 nm can be formed.

Here, instead of SiOC, an organic dielectric film may also suitably be used for the main dielectric film 220 of the wiring layer 100. Organic compounds having unsaturated bond such as polyarylene and polybenzooxazole can be used as the material of the organic dielectric film. Using such materials, a dielectric film whose relative dielectric constant k is 3 or less can be formed. The cap dielectric film 222 on the dielectric film 220 may be omitted.

At step S104, the wiring layer 111 is formed on the wiring layer 100 as the IM1 wiring layer formation process.

Figure 4:
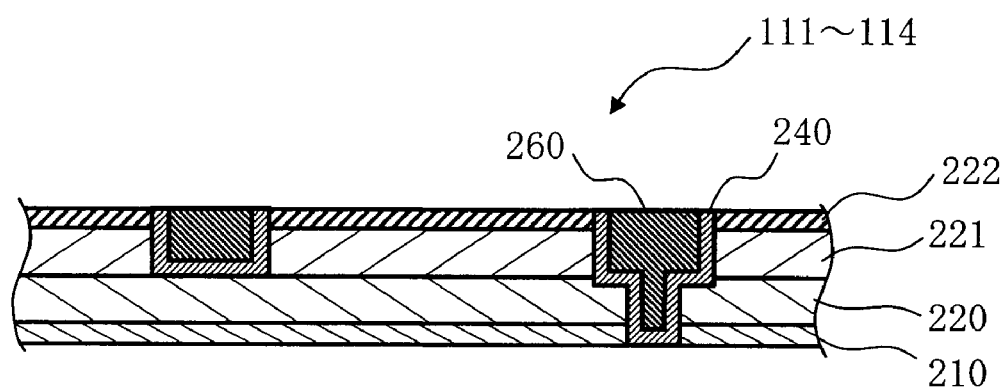
FIG. 4 is a diagram showing an example of the cross section of an IM (intermediate) wiring layer in the first embodiment.

FIG. 4 is a diagram showing an example of the cross section of an IM wiring layer in the first embodiment. First, an etching stopper film 210 is formed on the wiring layer 100 by the CVD method with deposition of, for example, 30 nm of the etching stopper film 210. As the material of the etching stopper film 210, for example, silicon carbonitride (SiCN: k=5.5), silicon carbide (SiC: k=3.5), silicon nitride (SiN: k=7.0), or laminated films of these may suitably be used.

Then, the dielectric film 220 for a via plug using a porous low-dielectric constant dielectric material is formed on the etching stopper film 210 to a thickness of, for example, 80 nm. Here, the same SiOC film as that of the main dielectric film of the LC wiring layer is formed. Using a porous SiOC film, an inter-level dielectric whose relative dielectric constant k is about 2.5 can be obtained. Thus, in addition to polymethylsiloxane whose main component is methylsiloxane, a film having siloxane backbone structures such as polysiloxane, hydrogen silsesquioxane, and methylsilsesquioxane may be used as the material of the dielectric film 220. The SOD method or CVD method, for example, may be used as a formation method. Here, polymethylsiloxane is applied according to the SOD method to form a film of the material and then, the film is baked on a hot plate in a nitrogen atmosphere. Then, the film is cured at temperature higher than that during baking on the hot plate in the nitrogen atmosphere. More specifically, after polymethylsiloxane is applied to a substrate by the SOD method, the substrate of polymethylsiloxane is pre-baked on a hot plate in a nitrogen atmosphere at 80° C. for one minute and at 200° C. for one minute. Subsequently, the substrate is cured on the hot plate in the nitrogen atmosphere at 350° C. for 30 minutes and then, cured by ultraviolet (UV) rays at a substrate temperature of 400° C. for 30 seconds. In this manner, the substrate is cured by supplying a predetermined amount of energy by heat and UV irradiation. The dielectric film 220 of k=2.6 and E=7 GPa can thereby be formed.

Then, the main dielectric film 221 for wire is formed on the dielectric film 220 to a thickness of, for example, 100 nm. An organic dielectric film may suitably be used for the dielectric film 221. Using an organic dielectric film, an inter-level dielectric whose relative dielectric constant k is about 2.5 can be obtained. Organic compounds having unsaturated bond such as polyarylene and polybenzooxazole can be used as the material of the organic dielectric film. Also here, after forming a film of organic material, the film is cured by supplying a predetermined amount of energy by heating, EB irradiation, or UV irradiation. The dielectric film 221 of k=2.4 and E=5 GPa can thereby be formed.

Then, SiOC is deposited onto the dielectric film 221 by the CVD method to a thickness of, for example, 30 nm to form the cap dielectric film 222. Here, the same SiOC film as that of the cap dielectric film 222 of the LC wiring layer is formed. Thus, for example, SiOC whose relative dielectric constant k is about 3.0 or $SiO_2$ whose relative dielectric constant k is about 4.0 can be used as the cap dielectric film 222. By forming the cap dielectric film 222, the dielectric film 221 of organic material whose mechanical strength is weak can be protected.

Then, a trench for making a damascene wire in the lithography and dry etching processes is formed in the cap dielectric film 222 and the dielectric film 221. Also, a via hole for embedding a via plug is formed in the dielectric film 220 and the etching stopper film 210. Then, the barrier metal film 240 similar to that in the LC wiring layer is formed in the via hole and trench and on the surface of the cap dielectric film 222 by the PVD method such as sputtering. Then, a Cu thin film to be a cathode electrode in the next electro-plating process is caused to deposit (form) on the inner walls of the via hole and trench and the surface of the substrate 200 where the barrier metal film 240 is formed as a seed film by sputtering or the like. Then, with the seed film as the cathode electrode, the Cu film 260 (an example of copper containing film) is caused to deposit inside the via hole and trench and on the surface of the substrate 200 by the electrochemical deposition method such as electro-plating. Then, after annealing treatment, the extra Cu film 260 and barrier metal film 240 deposited on the trench in such a state are removed by CMP to form a damascene wire to form the wiring layer 111. For example, a Cu wire whose minimum wire width is 70 nm can be formed. Then, for example, a wiring layer whose minimum wiring rule of line and space is 70 nm/70 nm and whose wiring height is 130 nm can be formed. Also, a via plug whose via diameter is 70 nm and whose height is 110 nm can be formed.

Here, instead of an organic dielectric film, SiOC whose carbon (C) concentration is smaller than that of SiOC to become the dielectric film 220 may suitably be used for the dielectric film 221. Also, instead of an organic dielectric film, SiOC whose film density is smaller than that of SiOC to become the dielectric film 220 may suitably be used for the dielectric film 221. By providing a difference in C concentration or film density, a selection ratio can be obtained for etching of a trench opening. Or, instead of an organic dielectric film, the same SiOC as that of the dielectric film 220 may suitably be used for the dielectric film 221, with an etching stopper film of, for example, 5 to 10 nm in thickness sandwiched between the dielectric film 221 and the dielectric film 220. SiOC (k=3), SiC (k=3.5), $SiO_2$ (k=4.0), or an organic film may be used as the material of the etching stopper film. In these cases, both the dielectric film 220 and the dielectric film 221 are SiOC dielectric films. Or, another possibility is as follows.

Figure 5:
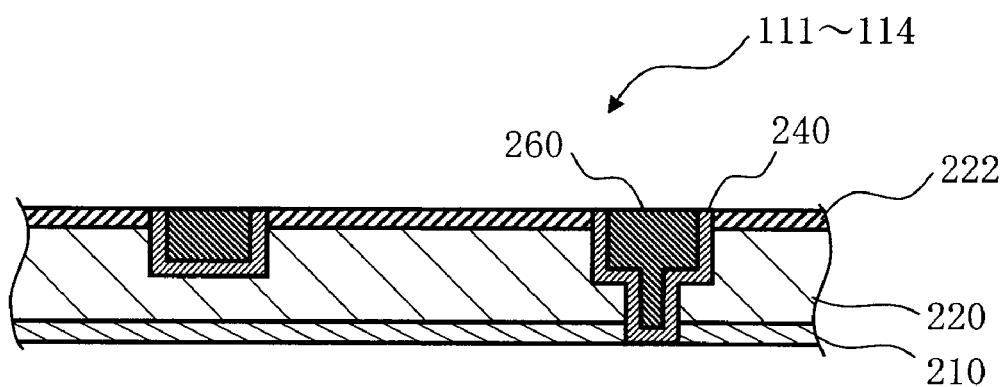
FIG. 5 is a diagram showing another example of the cross section of the IM wiring layer in the first embodiment.

FIG. 5 is a diagram showing another example of the cross section of the IM wiring layer in the first embodiment. As shown in FIG. 5, the main dielectric film may be formed of only the dielectric film 220 of SiOC without using the dielectric film 221. That is, for example, the dielectric film 220 using a porous low-dielectric constant dielectric material is formed on the etching stopper film 210 to a thickness of, for example, 180 nm. In that case, the amount of etching for trench opening may be controlled depending on time.

In any case described above, the film is cured by supplying a predetermined amount of energy by heat and UV irradiation. An SiOC dielectric film of k=2.6 and E=7 GPa can thereby be formed.

At step S106, the wiring layer 112 is formed on the wiring layer 111 as the IM2 wiring layer formation process. The formation method of the wiring layer 112 is the same as that of the wiring layer 111. Subsequently, at step S108, the wiring layer 113 is formed on the wiring layer 112 as the IM3 wiring layer formation process. The formation method of the wiring layer 113 is also the same as that of the wiring layer 111. Subsequently, at step S110, the wiring layer 114 is formed on the wiring layer 113 as the IM4 wiring layer formation process. The formation method of the wiring layer 114 is also the same as that of the wiring layer 111. In this manner, a plurality (here four layers) of the wiring layers 111, 112, 113, and 114 of the IM wiring layer group whose main dielectric films 220 and 221 are cured by a predetermined amount of energy is laminated.

At step S112, the wiring layer 121 is formed on the wiring layer 114, which is the top layer of the IM wiring layer group, as the SG1 wiring layer formation process. FIG. 6A to FIG. 6D are process sectional views of a manufacturing method of an SG1 wiring layer in the first embodiment. FIG. 6A to FIG. 6D show the ES film formation process (S202) to the cap film formation process (S208) in FIG. 2. Processes thereafter will be described later.

Figure 6A:
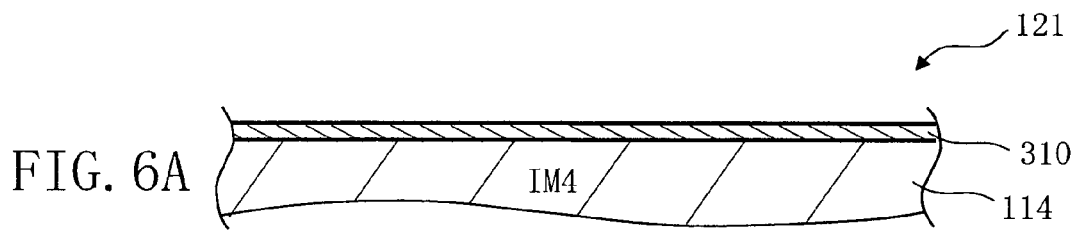
FIG. 6A to FIG. 6D are process sectional views of a manufacturing method of an SG (semi-global) 1 wiring layer in the first embodiment.

In FIG. 6A, as the ES film formation process (S202), SiCN is deposited onto the wiring layer 114 as an etching stopper layer to a thickness of, for example, 70 nm by the CVD method to form a thin film of an ES film 310. As the material of the ES film 310, for example, in addition to SiCN (k=5.5), SiC (k=3.5), SiN (k=7.0), or laminated films of these may suitably be used.

Figure 6B:
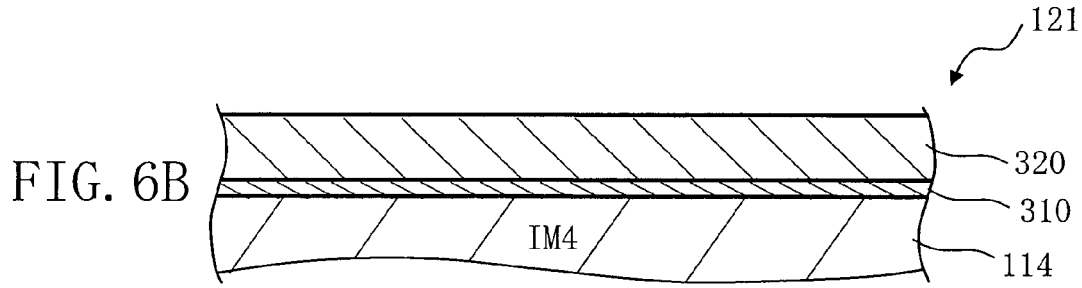

In FIG. 6B, as the low-k film formation process (S204), the dielectric film 320 having a thickness of, for example, 400 nm is formed on the ES film 310. Here, the same material as that of the dielectric film 220 in the IM wiring layer group is used. That is, polymethylsiloxane is applied according to the SOD method. Like the dielectric film 220, in addition to polymethylsiloxane whose main component is methylsiloxane, for example, a film having siloxane backbone structures such as polysiloxane, hydrogen silsesquioxane, and methylsilsesquioxane may be used as the material of the dielectric film 320.

Figure 6C:
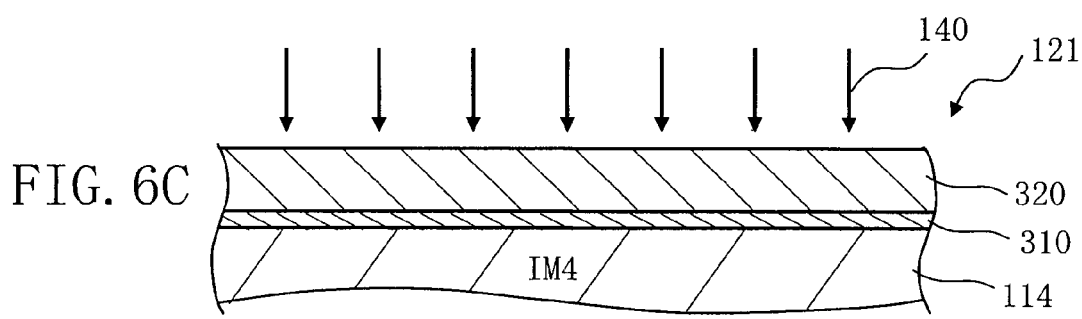

In FIG. 6C, as the cure process (S206), after the same material as that of the dielectric film 220 in the IM wiring layer group being applied, an energy line 140 is supplied for curing. UV rays, for example, are used as the energy line 140. More specifically, a substrate to which polymethylsiloxane is applied is pre-baked on a hot plate in a nitrogen atmosphere at 80° C. for one minute and at 200° C. for one minute. Subsequently, the substrate is thermally cured on the hot plate in the nitrogen atmosphere at 350° C. for 30 minutes and then, cured by UV rays whose wavelength $\lambda$ is 100 nm at the substrate temperature of 400° C. for 600 seconds. An SiOC film of k=3.0 and E=17 GPa can thereby be formed as the dielectric film 320.

In addition to UV rays, irradiation of EB, ions, neutral particles or fine particles may suitably be used as the energy line 140. For example, a substrate to which polymethylsiloxane is applied is pre-baked on a hot plate in a nitrogen atmosphere at 80° C. for one minute and at 200° C. for one minute. Subsequently, the substrate is thermally cured on the hot plate in the nitrogen atmosphere at 350° C. for 30 minutes and then, EB-cured at the substrate temperature of 400° C. and an acceleration voltage of 12 keV with 500 µC/cm$^2$. An SiOC film of k=3.0 and E=17 GPa can thereby be formed as the dielectric film 320. Among ions, those of an inert gas are suitable. Among neutral particles, those of an inert gas such as neon (Ne), argon (Ar), or krypton (Kr) having kinetic energy after being accelerated in one direction are suitable. In addition to energy being supplied by the energy line 140 as described above, energy may suitably be supplied by plasma treatment. For example, plasma treatment of argon (Ar) or helium (He) is suitable.

As described above, the Young's modulus E and the relative dielectric constant k can be enhanced by using the same material as that of the main dielectric film 220 in the lower IM wiring layer group and using an amount of energy different from that for forming the dielectric film 220 in the IM wiring layer group for curing.

Figure 6D:
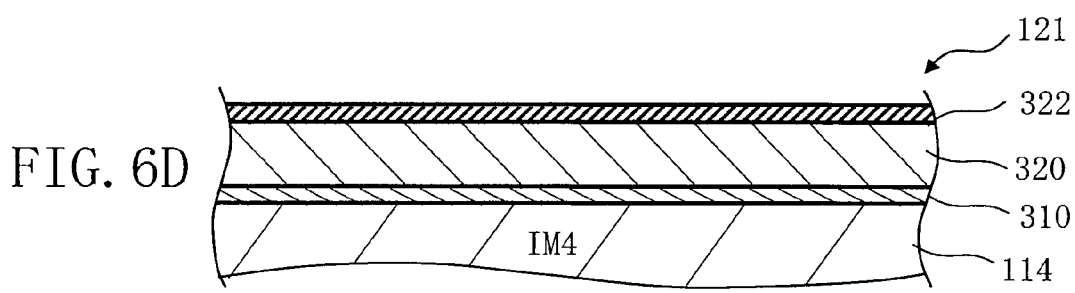

In FIG. 6D, as the cap film formation process (S208), a cap dielectric film 322 is formed by depositing SiOC onto the dielectric film 320 to a thickness of, for example, 50 nm by the CVD method. As the cap dielectric film 322, for example, SiO$_2$ whose relative dielectric constant k is about 4.0 may be used. By forming the cap dielectric film 322, the dielectric film 320 of SiOC whose mechanical strength is weak can be protected.

FIG. 7A to FIG. 7D are process sectional views of the manufacturing method of the SG1 wiring layer in the first embodiment. FIG. 7A to FIG. 7D show the opening formation process (S210) to the plating and annealing process (S216) in FIG. 2. Processes thereafter will be described later.

Figure 7A:
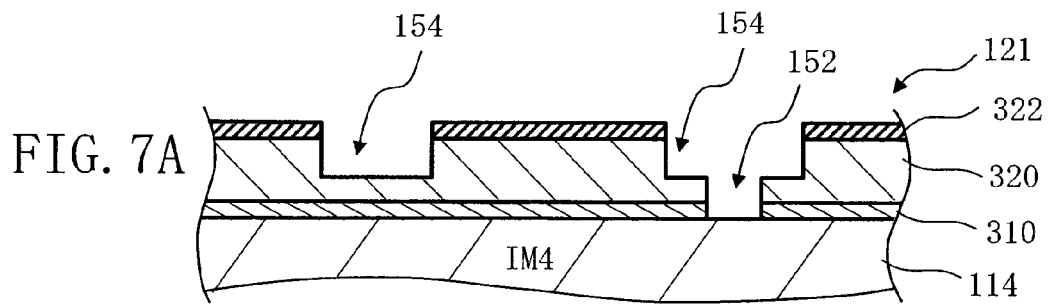
FIG. 7A to FIG. 7D are process sectional views of the manufacturing method of the SG 1 wiring layer in the first embodiment.

In FIG. 7A, as the opening formation process (S210), an opening 152 to be a via hole for making a damascene wire in the lithography and dry etching processes is formed in the cap dielectric film 322, the dielectric film 320, and the ES film 310. The cap dielectric film 322, which is exposed on the substrate 200 having a resist film on the cap dielectric film 322 formed through the lithography process such as a resist application process and an exposure process (not shown), and the dielectric film 320 positioned thereunder are removed by an anisotropic etching method using the ES film 310 as an etching stopper. Next, an opening 154 to be a trench for making a damascene wire is formed in the cap dielectric film 322 and the dielectric film 320. Also here, the cap dielectric film 322, which is exposed on the substrate 200 having a resist film on the cap dielectric film 322 formed through the lithography process such as a resist application process and an exposure process (not shown), and the dielectric film 320 positioned thereunder are removed by the anisotropic etching method. Here, the depth is controlled by time. Then, the exposed ES film 310 is removed by the etching method to form the openings 152, 154 of the wiring layer 121.

Figure 7B:
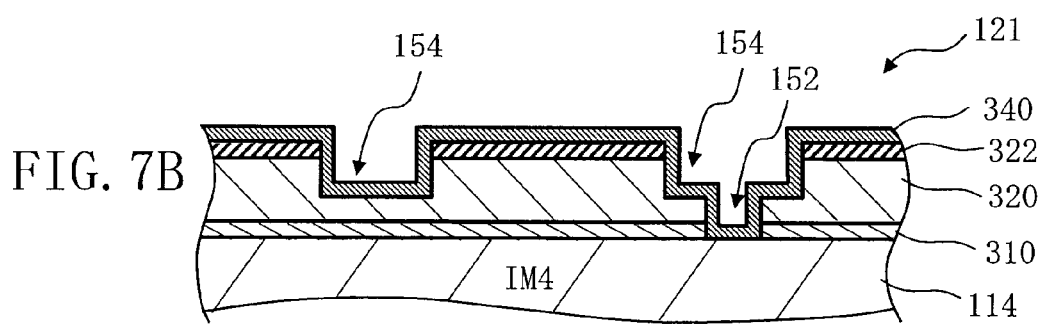

In FIG. 7B, as the barrier metal film formation process (S212), a barrier metal film 340 using a barrier metal material is formed in the openings 152, 154 formed in the opening formation process and on the surface of the cap dielectric film 322. For example, a thin film of Ta film is deposited to a thickness of, for example, 5 nm in a sputtering device using the sputtering process, which is one of the PVD method, to form the barrier metal film 340. The deposition method of a barrier metal material is not limited to the PVD method and other methods such as the atomic layer deposition (ALD) method (or the atomic layer chemical vapor deposition (AL-CVD) method) or the CVD method may also be used. The coverage factor can be made better than when the PVD method is used. In addition to Ta, tantalum containing materials such as TaN, titanium containing materials such as Ti and TiN, or laminated films combining these such as Ta and TaN as the material of the barrier metal film.

Figure 7C:
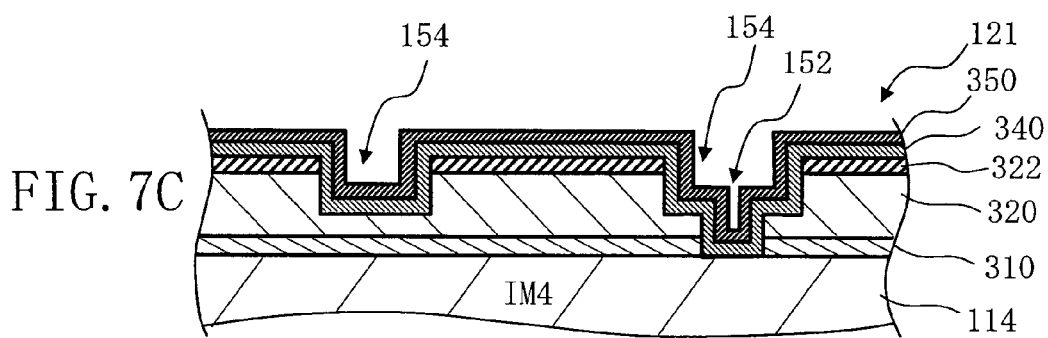

In FIG. 7C, as the seed film formation process (S214), a Cu thin film to be a cathode electrode in the next electro-plating process is caused to deposit (form) on the inner walls of the openings 152, 154 and the surface of the substrate 200 where the barrier metal film 340 is formed as a seed film 350 (an example of copper containing film) by the PVD method such as sputtering. Here, the seed film 350 is caused to deposit to a thickness of, for example, 50 nm.

Figure 7D:
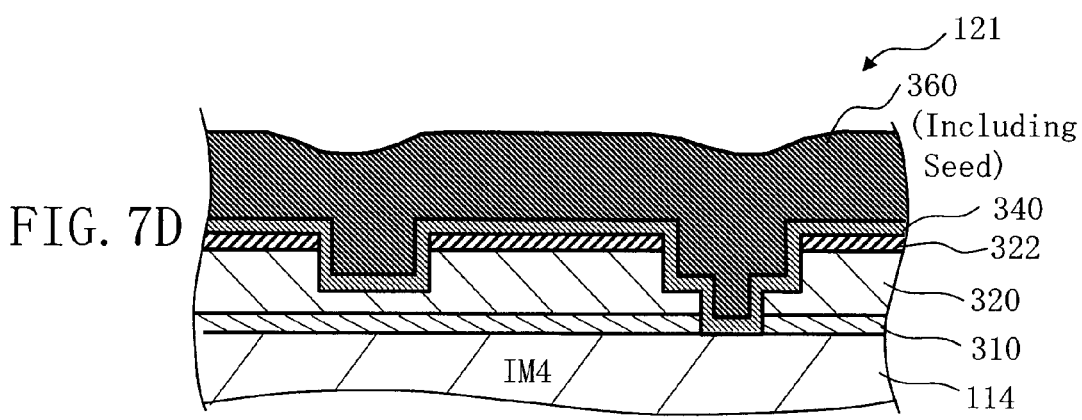

In FIG. 7D, as the plating and annealing process (S216), with the seed film 350 as the cathode electrode, a Cu film 360 (an example of copper containing film) is caused to deposit inside the openings 152, 154 and on the surface of the substrate 200 by the electrochemical deposition method such as electro-plating. Here, the Cu film 360 of, for example, 1000 nm in thickness is caused to deposit and after the deposition, annealing treatment is provided, for example, at 250° C. for 30 minutes.

Figure 8:
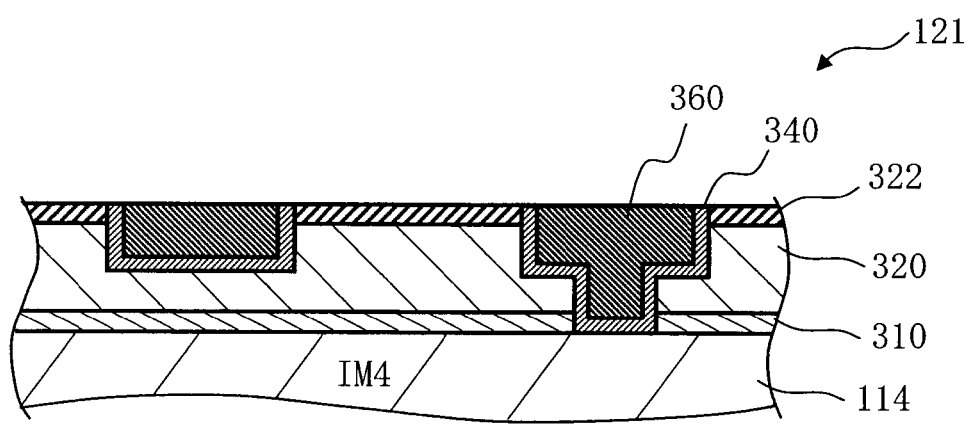
FIG. 8 is a process sectional view of the manufacturing method of the SG1 wiring layer in the first embodiment.

FIG. 8 is a process sectional view of the manufacturing method of the SG1 wiring layer in the first embodiment. FIG. 8 shows the polishing process (S218). In FIG. 8, as the polishing process (S218), the surface of the substrate 200 is polished by the CMP method to remove the Cu film 360 including the seed film 350 to be a wiring layer deposited on the surface excluding the openings 152, 154 and the barrier metal film 340 by polishing. As a result, as shown in FIG. 8, the substrate 200 can be planarized. As described above, the wiring layer 121 is formed by forming a dual damascene wire. For example, a Cu wire whose minimum wire width is 140 nm can be formed. Then, for example, a wiring layer whose minimum wiring rule of line and space is 140 nm/140 nm and whose wiring height is 280 nm can be formed. Also, a via plug whose via diameter is 140 nm and whose height is 230 nm can be formed.

Figure 9:
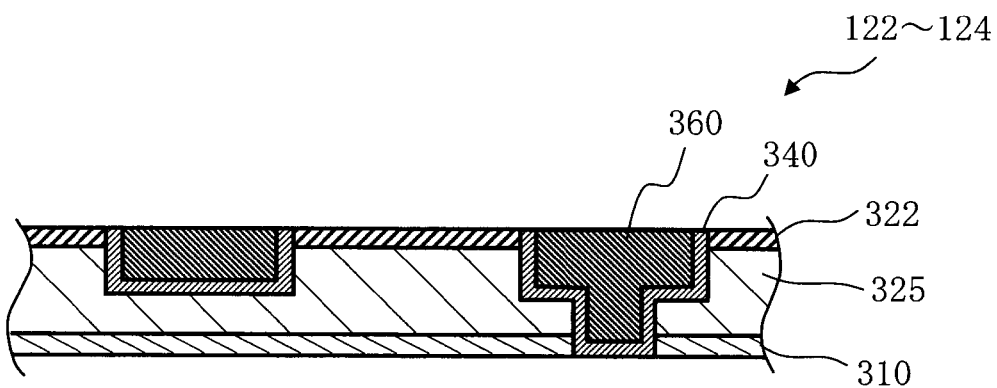
FIG. 9 is a diagram showing an example of the cross section of SG2-4 wiring layers in the first embodiment.

At step S114, the wiring layer 122 is formed on the wiring layer 121 as the SG2 wiring layer formation process. The formation method of the wiring layer 122 is the same as that of the wiring layer 121 except for the main dielectric film. FIG. 9 is a diagram showing an example of the cross section of SG2-4 wiring layers in the first embodiment. First, an ES film 310 is formed on the wiring layer 121 by the CVD method. Then, SiOC without pores is caused to deposit onto the ES film 310 using the CVD method to a thickness of, for example, 400 nm to form the dielectric film 325. Then, a predetermined amount of energy is supplied by heat, EB irradiation, or UV irradiation for curing. Accordingly, the dielectric film 325 having k=3.0, which is substantially the same as that of the dielectric film 320, and E=20 GPa, which is larger than that of the dielectric film 320, can be formed. When an SiOC film is formed by the CVD method, the desired Young's modulus E and relative dielectric constant k can be obtained by adjusting the type of precursor of a CVD material gas, the amount of porogen material, and the amount of added carbon when needed. The SOD method may also be used as a formation method thereof. Also in this case, the desired Young's modulus E and relative dielectric constant k can be obtained by adjusting the mixing ratio of a plurality of materials having different relative dielectric constants k. Then, the cap dielectric film 322 is formed by depositing $SiO_2$ onto the dielectric film 325 by the CVD method to a thickness of, for example, 50 nm.

Then, the barrier metal film 340 is formed inside the open via hole and trench. Then, the Cu film 360 is caused to deposit onto the inner walls of via hole and trench on which the barrier metal film 340 is formed. By forming a dual damascene wire in this manner, the wiring layer 122 is formed. In the wiring layer 122, like the wiring layer 121, a Cu wire whose minimum wire width is, for example, 140 nm can be formed. Then, for example, a wiring layer whose minimum wiring rule of line and space is 140 nm/140 nm and whose wiring height is 280 nm can be formed. Also, a via plug whose via diameter is 140 nm and whose height is 230 nm can be formed.

Subsequently, at step S116, the wiring layer 123 is formed on the wiring layer 122 as the SG3 wiring layer formation process. The formation method of the wiring layer 123 is the same as that of the wiring layer 122. Subsequently, at step S118, the wiring layer 124 is formed on the wiring layer 123 as the SG4 wiring layer formation process. The formation method of the wiring layer 124 is the same as that of the wiring layer 123. In this manner, a plurality (here four layers) of the wiring layers 121, 122, 123, and 124 of the SG wiring layer group in which the Young's modulus of the bottom layer is smaller is laminated.

Here, the Young's modulus of the main dielectric film 320 is made smaller only in the bottom layer of the SG wiring layer group, but the present embodiment is not limited to this. The Young's modulus of the main dielectric film of a wiring layer two layers or more above the bottom layer may be made smaller than that of other wiring layers in the SG wiring layer group. It is sufficient that at least one or more layers remain as other layers of the SG wiring layer group with a larger Young's modulus.

At step S120, the wiring layer 131 is formed on the wiring layers 124, which is the top layer of the SG wiring layer group, as the GL1 wiring layer formation process.

Figure 10:
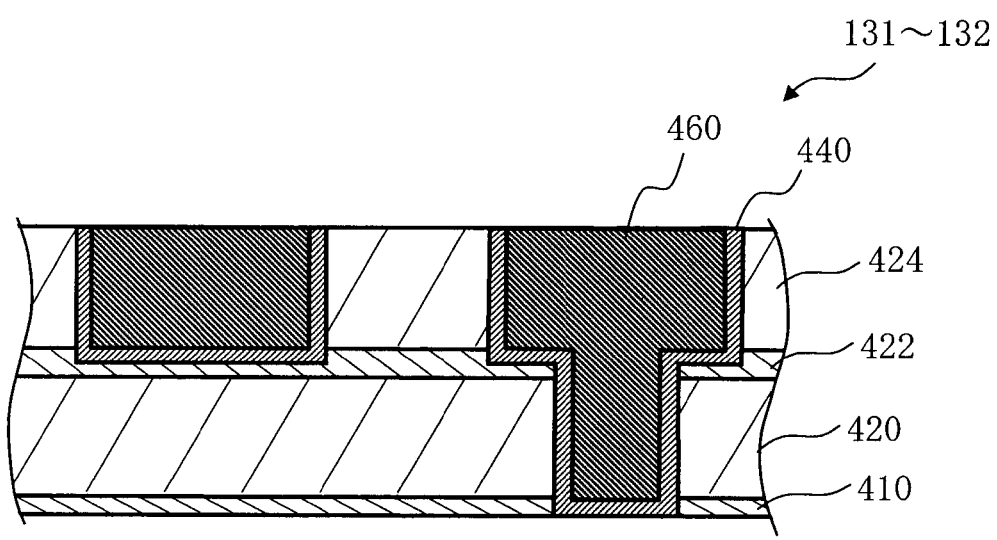
FIG. 10 is a diagram showing an example of the cross section of a GL (global) wiring layer in the first embodiment.

FIG. 10 is a conceptual diagram showing an example of the cross section of a GL wiring layer in the first embodiment.

First, a thin film of an etching stopper film 410 is formed by depositing SiCN onto the wiring layer 124 by the CVD method as an etching stopper film to a thickness of, for example, 100 nm. As the material of the etching stopper film 410, for example, in addition to SiCN (k=5.5), SiC (k=3.5), SiN (k=7.0), or laminated films of these may suitably be used. Then, $SiO_2$ is caused to deposit onto the etching stopper film 410 by using the CVD method to a thickness of, for example, 700 nm to form the dielectric film 420. The main dielectric film 420 for a via plug of k=4.1 and E=50 GPa can thereby be formed. Then, an etching stopper film 422 is formed by depositing SiN onto the dielectric film 420 by the CVD method to a thickness of, for example, 150 nm. In addition to SiN, SiCN, SiC, or laminated films of these may suitably be used as the material of the etching stopper film 422. Subsequently, $SiO_2$ is caused to deposit onto the etching stopper film 422 by using the CVD method to a thickness of, for example, 1000 nm to form the dielectric film 424. The main dielectric film 424 for wire of k=4.1 and E=50 GPa can thereby be formed.

Then, a barrier metal film 440 is formed in the via hole opened with the etching stopper film 410 as an etching stopper and the trench opened with the etching stopper film 422 as an etching stopper. Then, a Cu film 460 is caused to deposit onto the inner walls of the via hole and trench on which the barrier metal film 440 is formed. As described above, the wiring layer 131 is formed by forming a dual damascene wire. In the wiring layer 131, for example, a Cu wire whose minimum wire width is 1000 nm can be formed. Then, for example, a wiring layer whose minimum wiring rule of line and space is 1000 nm/1000 nm and whose wiring height is 1100 nm can be formed. Also, a via plug whose via diameter is 600 nm and whose height is 850 nm can be formed.

Subsequently, at step S122, the wiring layer 132 is formed on the wiring layer 131 as the GL2 wiring layer formation process. The formation method of the wiring layer 132 is the same as that of the wiring layer 131. In this manner, a plurality (here two layers) of the wiring layers 131 and 132 of the SL wiring layer group is laminated.

At step S124, as the ES film formation process, SiN is caused to deposit onto the wiring layer 132, which is the top layer of the GL wiring layer group, to a thickness of, for example, 70 nm to form a ES film 426. As the material of the ES film 426, in addition to SiN, SiCN, SiC, or laminated films of these may suitably be used.

As described above, the dielectric film 320 whose Young's modulus is larger than that of the dielectric films 220, 221 and smaller than that of the dielectric film 325 while maintaining the relative dielectric constant k substantially the same as that of the dielectric film 325 by using the same material as that of the dielectric film 220 and changing curing conditions.

Figure 11:
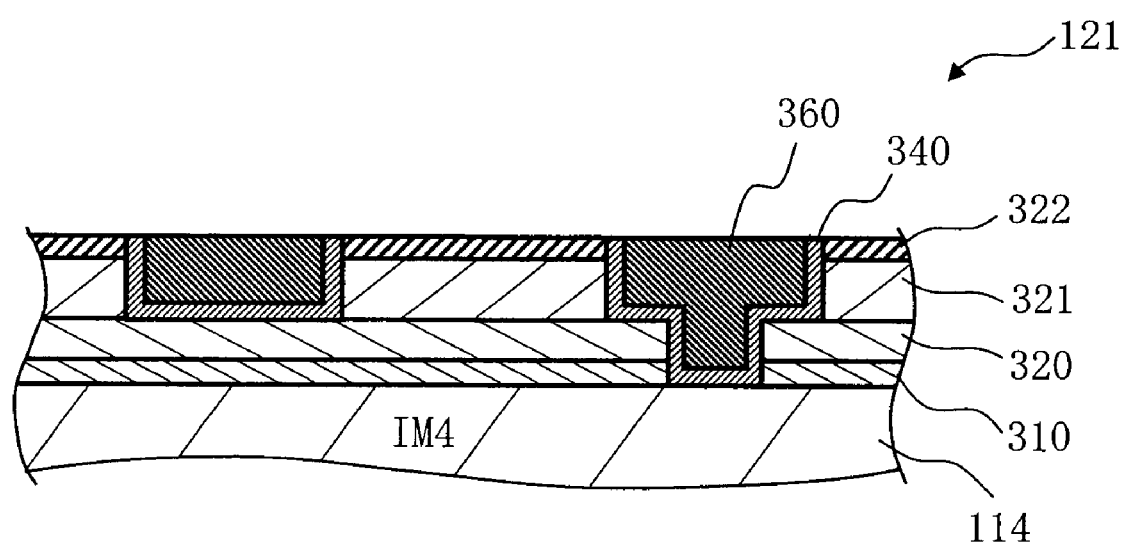
FIG. 11 is a diagram showing an example of the cross section of the SG 1 wiring layer in the first embodiment.

Here, in the above example of the SG wiring layer group, the main dielectric film is formed of SiOC only, but the present embodiment is not limited to this. FIG. 11 is a diagram showing an example of the cross section of the SG 1 wiring layer in the first embodiment. As shown in FIG. 11, for the wiring layer 121, the dielectric film 320 using SiOC may be used for a via plug and the other main dielectric film 321 for a wire. In this manner, a two-layer hybrid structure may be adopted. Organic compounds having unsaturated bond such as polyarylene and polybenzooxazole can be used as the material of the dielectric film 321. Also in this case, the desired Young's modulus E and relative dielectric constant k can be obtained by adjusting the mixing ratio of a plurality of materials having different relative dielectric constants k. Also for the other wiring layers 122, 123, and 124 of the SG wiring layer group, the two-layer hybrid structure of the main dielectric film may be adopted. Also in this case, for the wiring layer 121, both the dielectric film 320 and the dielectric film 321 have substantially the same relative dielectric constant k as that of the main dielectric films of the other wiring layers 122, 123, and 124 of the SG wiring layer group. Then, similarly, the Young's modulus E of at least one of the dielectric film 320 and the dielectric film 321 is made larger than that of the main dielectric films 220, 221 of the IM wiring layer group and smaller than that of the main dielectric films of the other wiring layers 122, 123, and 124 of the SG wiring layer group.

A rapid change of the Young's modulus E can also be lessened by configuring as described above. In this manner, stress concentration being applied to a specific wiring layer can be lessened and, as a result, resistance to peeling of a film between wiring layers due to force of external factors can be improved. Therefore, yields of semiconductor devices can be improved.

Second Embodiment

In the first embodiment, the dielectric film 320 in the bottom layer of the SG wiring layer group by using the same material as that of the dielectric film 220 in the IM wiring layer group and changing curing conditions. In a second embodiment, a case in which the Young's modulus E of only the main dielectric films of the bottom layer is made smaller while maintaining the relative dielectric constant k substantially the same by using the same material for each wiring layer of the SG wiring layer group and changing curing conditions will be described. Even if the Young's modulus E is made smaller, the dielectric films are formed so that Young's modulus E thereof is larger than that of at least one of the dielectric films 220, 221 of the IM wiring layer group. The configuration of a semiconductor device is the same as that shown in FIG. 1. The manufacturing method is the same as that in the first embodiment except the formation method of the dielectric films 320, 325 in the SG wiring layer group.

S102 to S110 and up to S202 in S112 shown in FIG. 2 are the same as those in the first embodiment. The formation method of the dielectric film 320 in the wiring layer 121, which is the bottom layer of the SG wiring layer group, will be described below. In FIG. 6B, as the low-k film formation process (S204), the dielectric film 320 is formed on the ES film 310 to a thickness of, for example, 400 nm. Here, polymethylsiloxane is applied according to the SOD method.

Then, curing by heat is performed as the cure process (S206). More specifically, a substrate to which polymethylsiloxane is applied is pre-baked on a hot plate in a nitrogen atmosphere at 80° C. for one minute and at 200° C. for one minute. Subsequently, the substrate is thermally cured on the hot plate in the nitrogen atmosphere at 400° C. for 30 minutes. An SiOC film of k=3.0 and E=15 GPa can thereby be formed as the dielectric film 320. S208 to S218 thereafter are the same as those in the first embodiment.

Next, the formation method of the dielectric film 325 of the other wiring layers 122 to 124 in the SG wiring layer group will be described below. A material similar to that of the dielectric film 320 is formed into a film on the ES film 310 to a thickness of, for example, 400 nm. More specifically, polymethylsiloxane is applied according to the SOD method. Then, EB curing is performed as the cure process. More specifically, a substrate to which polymethylsiloxane is applied is pre-baked on a hot plate in a nitrogen atmosphere at 80° C. for one minute and at 200° C. for one minute. Subsequently, the substrate is EB-cured at the substrate temperature of 400° C. and an acceleration voltage of 25 keV in a nitrogen atmosphere of $1.33 \times 10^3$ Pa (10 Torr) with the dose amount of 500 µC/cm². An SiOC film of k=3.0 and E=25 GPa can thereby be formed as the dielectric film 325. Processes thereafter are the same as those in the first embodiment.

Or, instead of EB curing, UV curing may be used. More specifically, a substrate to which polymethylsiloxane is applied is pre-baked on a hot plate in a nitrogen atmosphere at 80° C. for one minute and at 200° C. for one minute. Subsequently, the substrate is UV-cured at the substrate temperature of 400° C. in a nitrogen atmosphere of $1.33 \times 10^3$ Pa (10 Torr) by irradiation of UV rays whose wavelength is 100 nm for 20 minutes. Also under these conditions, an SiOC film with k=3.0 and E=25 GPa can be formed as the dielectric film 325.

As described above, by using the same material for each wiring layer of the SG wiring layer group and changing the amount of energy supplied through adjustments of curing conditions only for the bottom layer, the Young's modulus E can be made smaller while maintaining the relative dielectric constant k substantially the same only for the main dielectric films of the bottom layer.

Third Embodiment

In the first and second embodiments, the relative dielectric constant k and the Young's modulus E are adjusted by changing the amount of energy supplied through adjustments of curing conditions. In a third embodiment, a case in which the Young's modulus E of the obtained dielectric film 320 is set to be larger than that of at least one of the dielectric films 220, 221 of the IM wiring layer group and the relative dielectric constant k is set to be substantially the same as that of the dielectric film 325 of the other layers of the SG wiring layer group by adjusting the amount of porogen material in the material of the dielectric film 320 in the bottom layer of the SG wiring layer group will be described. It is adjusted so that the Young's modulus E thereof is larger than that of at least one of the dielectric films 220, 221 of the IM wiring layer group, but is smaller than that of the dielectric film 325 of the other layers in the SG wiring layer group. The configuration of a semiconductor device is the same as that shown in FIG. 1. The manufacturing method is the same as that in the first embodiment except the formation methods of the dielectric film 220 in the IM wiring layer group and the dielectric films 320, 325 in the SG wiring layer group.

S102 in FIG. 2 is the same as that in the first embodiment. For the formation of the dielectric film 220 in the wiring layer 111 of the IM wiring layer group at step S104, the dielectric film 220 using a porous low-dielectric constant dielectric material is formed on the etching stopper film 210 to a thickness of, for example, 180 nm. Here, an SiOC film with 25% pores is used as the dielectric film 220. An SiOC film of k=2.4 and E=5 GPa can thereby be formed as the dielectric film 220. While a structure, as shown in FIG. 5, in which the main dielectric film is only the dielectric film 220 of SiOC is described here, as shown in FIG. 4, a hybrid structure of the dielectric film 220 of SiOC and the dielectric film 221 an organic film may also be adopted. This applies also to the formation of the dielectric film 220 of the wiring layers 112, 113, and 114 in the IM wiring layer group at steps S106 to S110. Other formation methods of the wiring layers 111, 112, 113, and 114 in the IM wiring layer group are the same as those in the first embodiment.

For the formation of the dielectric film 320 in the wiring layer 121, which is the bottom layer of the SG wiring layer group at step S112, on the other hand, an SiOC film without pore is used as the dielectric film 320. An SiOC film of k=3.0 and E=8 GPa (7.9 GPa) can thereby be formed as the dielectric film 320. While an example of forming the dielectric film 320 of SiOC without pore is described here, the desired Young's modulus E and relative dielectric constant k can be obtained by adjusting the pore ratio in a range lower than that of the dielectric film 220 in the wiring layers 111 to 114 of the IM wiring layer group.

Then, for the formation of the dielectric film 325 in the wiring layers 122, 123, and 124 of the SG wiring layer group at steps S114 to S118, an SiOC film without pore and of another precursor is used as the dielectric film 325. An SiOC film of k=3.0 and E=13 GPa can thereby be formed as the dielectric film 325. Other formation methods are the same as those in the first embodiment.

In the above description, a similar effect can be produced by using, other than Cu as a material of wiring layers in each of the above embodiments, materials containing Cu as a main component such as a Cu—Sn alloy, a Cu—Ti allow, and a Cu—Al alloy.

Embodiments of the invention have been described above with reference to concrete examples. However, the invention is not limited to these concrete examples.

Further, the thickness of inter-level dielectric, the size, shape, and number of openings and the like may be used by selecting what is needed for semiconductor integrated circuits and various semiconductor devices as needed.

In addition, all semiconductor devices and manufacturing methods of semiconductor devices having elements of the invention and whose design can be modified as needed by those skilled in the art are included in the scope of the invention.

Though techniques normally used in the semiconductor industry, for example, a lithography process and cleaning before and after treatment are omitted for simplification of the description, these techniques are naturally included in the scope of the invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device, comprising:
a plurality of first group wiring layers laminated on a substrate, and each of the first group wiring layers having a wire formed with a first minimum wire width and a main dielectric film portion; and
a plurality of second group wiring layers laminated on a top layer of the plurality of first group wiring layers and each of the second group wiring layers having a wire formed with a second minimum wire width greater than the first minimum wire width and a main dielectric film portion,
wherein a main dielectric film portion in a bottom layer of the plurality of second group wiring layers has a relative dielectric constant which is substantially identical to a relative dielectric constant of main dielectric film portions of the other second group wiring layers, and
Young's modulus of the main dielectric film portion in the bottom layer of the plurality of second group wiring layers is smaller than those of the main dielectric film portions of the other second group wiring layers and larger than those of main dielectric film portions of the first group wiring layers.

2. The device according to claim 1, wherein both the main dielectric film portion in the bottom layer of the plurality of second group wiring layers and those of the first group wiring layers use a silicon oxycarbide (SiOC) film.

3. The device according to claim 1, wherein the main dielectric film portion of the first group wiring layers is formed of two layers; and
the main dielectric film portion in the bottom layer of the plurality of second group wiring layers has a Young's modulus larger than that of at least one of two layers of the main dielectric film portion of the first group wiring layers.

4. The device according to claim 1, wherein both the main dielectric film portion in the bottom layer of the plurality of second group wiring layers and those of the first group wiring layers use a silicon oxycarbide (SiOC) film.

* * * * *